United States Patent
Kalimuthu et al.

(10) Patent No.: US 11,927,629 B2
(45) Date of Patent: Mar. 12, 2024

(54) GLOBAL TIME COUNTER BASED DEBUG

(71) Applicant: Texas Instruments Incorporated, Dallas, TX (US)

(72) Inventors: Pandy Kalimuthu, Plano, TX (US); Anthony Joseph Lell, San Antonio, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/486,675

(22) Filed: Sep. 27, 2021

(65) Prior Publication Data

US 2023/0115615 A1   Apr. 13, 2023

(51) Int. Cl.
*G01R 31/3177* (2006.01)
*G06F 1/10* (2006.01)

(52) U.S. Cl.
CPC .......... *G01R 31/3177* (2013.01); *G06F 1/10* (2013.01)

(58) Field of Classification Search
CPC .............................. G01R 31/3177; G06F 1/10
See application file for complete search history.

(56) References Cited

U.S. PATENT DOCUMENTS

| | | | |
|---|---|---|---|
| 8,261,159 B1* | 9/2012 | Sommer | G06F 11/1048 713/193 |
| 10,846,201 B1* | 11/2020 | Diamant | G06F 11/348 |
| 2008/0059828 A1* | 3/2008 | Siggelkow | G06F 11/3648 714/E11.207 |
| 2009/0006894 A1* | 1/2009 | Bellofatto | G06F 11/2236 714/34 |
| 2012/0146658 A1* | 6/2012 | Rentschler | G06F 11/3632 324/537 |
| 2012/0150474 A1* | 6/2012 | Rentschler | G01R 31/31705 702/117 |
| 2012/0151263 A1* | 6/2012 | Rentschler | G06F 11/267 714/E11.147 |
| 2016/0062331 A1* | 3/2016 | Von Wendorff | G05B 19/042 702/66 |
| 2017/0180236 A1* | 6/2017 | Lyra | G06F 11/3636 |
| 2018/0276052 A1* | 9/2018 | Kim | G06F 9/524 |

* cited by examiner

*Primary Examiner* — Shelly A Chase
*Assistant Examiner* — Osman M Alshack
(74) *Attorney, Agent, or Firm* — Michael T. Gabrik; Frank D. Cimino

(57) ABSTRACT

Techniques for debugging a circuit including a global counter configured to continuously increment, a comparator configured to transmit a clock stop signal based on a comparison of a comparator value and a counter value of the global counter, and clock stop circuitry configured to receive the clock stop signal and stop a clock signal to one or more portions of the electronic device.

20 Claims, 2 Drawing Sheets

GLOBAL TIME COUNTER BASED DEBUG

BACKGROUND

Embedded systems are widely used in a variety of applications and generally include one or more processors and other circuitry that performs desired functions. For example, an embedded system may include one or more processors, such as a microcontroller, digital signal processor, etc., along with devices, such as a cache controller, various peripheral devices for interfacing with analog sensors, hardware accelerators, and/or other such devices. Embedded systems may be included with (e.g., built-in or embedded) within other systems. For example, a car may include many embedded systems for operating various components, such as infotainment systems, engine/motor controllers, braking systems, etc. Developing and/or utilizing these embedded systems often include debugging one or more portions of the system.

Often, debugging embedded systems can be time consuming and complex. For example, while software implemented debug points may be available, such debug points often require processor operations to stop operations. Stopping operations using the processor can be imprecise and may be of limited use when debugging non-processor specific issues, such as an issue arising from the various peripheral components and hardware accelerators. Additionally, processor-based debugging typically depends on processor operations, rather than operations of devices other than the processor.

SUMMARY

This disclosure relates to a technique for debugging an electronic device, including a global counter configured to continuously increment, a comparator configured to transmit a clock stop signal based on a comparison of a comparator value and a counter value of the global counter, and clock stop circuitry configured to receive the clock stop signal and stop a clock signal to one or more portions of the electronic device.

Another aspect of the present disclosure relates to a method, the method including receiving a counter value for a global counter, comparing a comparator value and the counter value, and transmitting a clock stop signal to stop a clock signal to one or more portions of an electronic device based on the comparison of the comparator value and the counter value.

Another aspect of the present disclosure relates to a circuit for debugging, the circuit including a global counter configured to continuously increment, a comparator configured to transmit a clock stop signal based on a comparison of a comparator value and a counter value of the global counter, and clock stop circuitry configured to receive the clock stop signal and stop a clock signal to one or more portions of the electronic device.

BRIEF DESCRIPTION OF THE DRAWINGS

For a detailed description of various examples, reference will now be made to the accompanying drawings in which.

DETAILED DESCRIPTION

Debugging an embedded system is an important part of developing embedded systems and/or working with embedded systems. For example, portions of the embedded systems may execute embedded software which may need to be debugged during the development process when the embedded system may not be behaving as expected.

Figure 1:
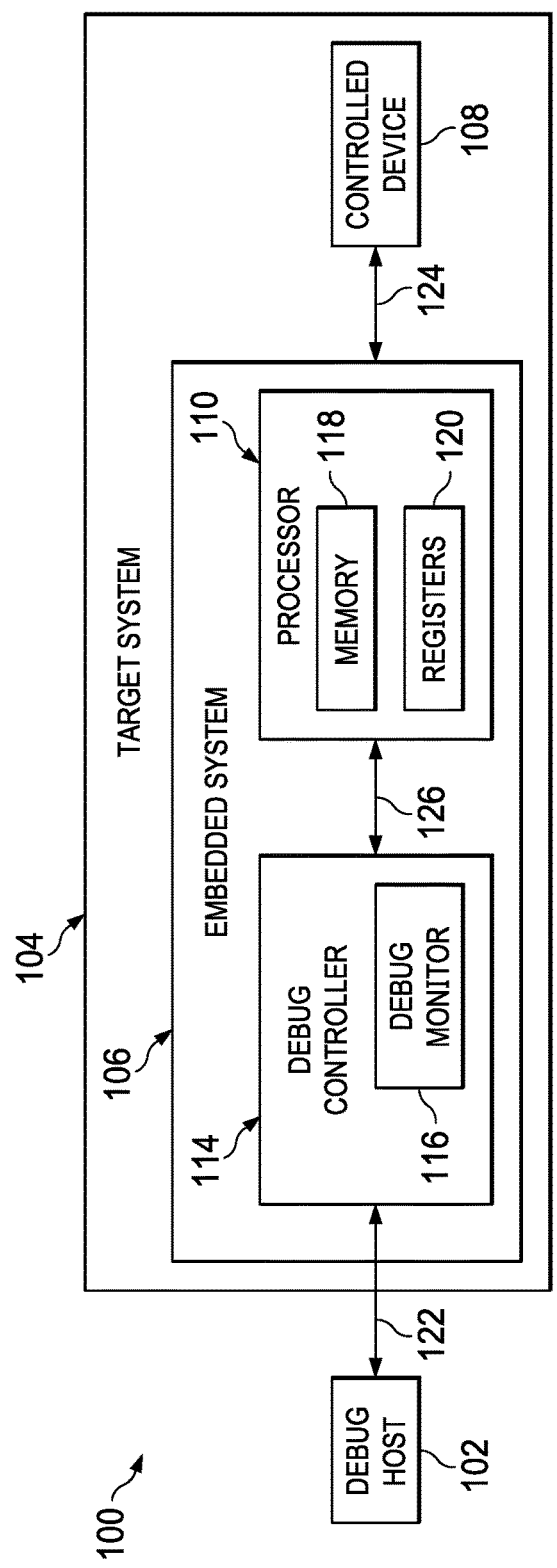
FIG. 1 is a block diagram illustrating an example debug environment for an embedded system, in accordance with aspects of the present disclosure.

FIG. 1 is a block diagram 100 illustrating an example debug environment for an embedded system, in accordance with aspects of the present disclosure. This example debug environment includes a debug host 102, and a target system 104. The target system 104 includes an embedded system 106 along with a controlled device 108. In this example, the embedded system 106 is an electronic system and includes a processor 110 and a debug controller 114 (e.g., a microprocessor, which may be separate from, or integrated with, processor 110). As a more concrete example, a target system 104 may be a car, the embedded system 106 may be a door lock controller for the car, and the controlled device 108 may be a door lock actuator. It should be noted that debugging environments may vary from the example shown here. For example, the embedded system 106 may be debugged separately from (e.g., not coupled to) the target system 104 or the controlled device 108. In some cases, the debug controller 114 may include a debug monitor 116 or other code executing on debug controller 114 to assist in controlling a debug session for code executing on target system 104. While in some cases, the debug monitor 116 may execute on the debug controller 114, in other cases that portions of debug monitor may execute on processor 110 and/or the debug host 102 and coordinate with other portions of debug monitor executing on debug controller 114. In some examples, the controlled device 108 may be any electrical device that is configured to operate in conjunction with the embedded system 106, and the controlled device 108 may be coupled to the embedded system 106 via an interface 124. Examples of controlled devices 108 may include a hardware accelerator, cache controller, phase-locked loop (PLL), peripheral controller, motor, actuator, sensor, etc. While one controlled device 108 is shown in this example, any number of controlled devices 108 may be coupled to the embedded system 106.

In some cases, a user may interact with and debug the target system 104 via the debug host 102, for example, using a user interface. The debug host 102, here coupled to the debug controller 114, allows the user to interact with the target system 104 directly or indirectly, for example, via an input/output interface 122. As an example, the debug host may be an electronic device such as a standalone computer, remote server, virtual machine, etc., coupled to the embedded system 106 and executing debugging software. Examples of the input/output interface 122 may also include a peripheral cable, a network connection, etc. These interactions may include physically changing settings on target system 104 via direct adjustment of controls (not shown) on target system 104, creating a hardware interrupt to cause a breakpoint for debugging at a certain time as opposed to, programming in a software determined breakpoint, etc.

In this example, processor 110 may be, for example, an embedded processor, multi-core processor, DSP, machine learning processor, or other processor that exchanges control and/or other operational signals with the controlled device 108 via an interface 124. By way of example but not limitation, processor 110 may be a microcontroller and controlled device 108 may be an actuator having a motor that is controlled according to signals provided by the processor 110. Controlled device 108 may also be external to target system 104, for example a remote sensor or other device read or controlled by remote communication commands (e.g., commands via a communication input/output port, network interface, communication bus, etc.). Also, in the event that there are multiple cores on processor 110, there may be multiple instances of debug controller 114 and debug monitor 116. For example, there may be a debug controller/debug monitor pair associated with an individual core to allow for debugging of processes executing on that respective core. In this manner, it may be possible to debug applications across the multiple cores or individually on a single core.

In this example, processor 110 executes code that may be stored in an associated memory 118 (which may be integrated within processor 110 and/or external thereto) to perform predetermined functions. Processor 110 includes registers 120, which may include debug registers, associated therewith, which may also be either integral with the processor 120 or implemented externally. As illustrated in this example, debug controller 114 may interface with processor 110 via an interface 126 to access (read only or read/write as appropriate) to memory 118 and registers 120 associated with processor 110. The interface 126 may be a bus within an integrated circuit (IC) when debug controller 114 is internal to the IC containing processor 110 or may be provided using an access port (sometimes referred to as an indirect access port). Similarly, the debug controller 114 is communicatively coupled to and may interface with the controlled device 108 via an interface (not shown). In some cases, a separate debug controller 114 may be provided for the controlled device 108 and the processor 110.

In this example, debug host 102 is shown communicatively coupled to target system 104 (and debug controller 114) via an interface 122. This interface 122 may be used to provide communication between debug host 102 and debug controller 114, for example, to provide user commands and obtain query output from an application developer performing a debug session on target system 104.

In some cases, the debug controller 114 may be used to debug elements of the embedded system 106, such as the processor 110 and/or controlled device 108, using, for example, break events. A break event may trigger a special interrupt which causes the processor 110 or controlled device 108 to execute an interrupt service routine (ISR) in which the processor 110 or controlled device 108 waits for either a command to resume execution or for an enabled time-critical interrupt to occur. This type of interrupt service may be provided by the debug monitor 116. As an example, upon the debug monitor 116 executing a particular interrupt, clock stop circuitry may be triggered, causing one or more clock circuits to be stopped, thereby freezing the system. A state of the flops in the embedded system 106 may then be scanned out for debugging.

The debug monitor 116 may be implemented by code executed by the processor 110 after being placed in a debug state. In some cases, the debug monitor 116 may include hardware logic as opposed to software-based debug monitors 116. A debug monitor 116 may be configured to execute on a processor, such as processor 110, or an auxiliary processor (e.g., of the debug controller 114) that is communicatively coupled to the processor as well as memory, registers, input/output ports, controlled device 108, and any other portions of the IC containing both the processor and the debug controller. The debug monitor 116 provides a form of execution control. The debug monitor 116 (and debug controller 114) may be coupled to, but separate from, the debug host 102. The debug host 102 may be external to the target system 104 under test and the debug host 102 provides a user interface to the debug session. Thus, the debug host typically interfaces with the debug monitor 116 executing on the processor 110, the debug controller 114, or a combination of both.

The debug monitor 116 may be configured to provide communications with the processor 110 or controlled device 108 being debugged, the debug controller 114, the debug host 102, and ultimately the application developer by staging information in one or more registers that may be scanned. In this implementation technique, the debug controller may scan in commands and scan out results. When halted, the processor may be configured to execute the debug monitor 116 internal to the processor (e.g., on a debug controller auxiliary processor or the main processor to the exclusion of other tasks). The debug controller 114, in turn, typically executes interrupt service routines (ISRs) while performing commands. The debug controller 114 may be internal to the processor (e.g., built-in or tightly coupled to the processor), and the debug controller 114 may occupy on-chip system resources such as program and data memory. However, setting break points using the processor can be imprecise as these break points need to execute certain instructions in the processor and may not be responsive to non-processor-based debugging issues. In accordance with aspects of the present disclosure, a global time counter based debug may provide a more lightweight and precise technique for setting break points for debugging.

Figure 2:
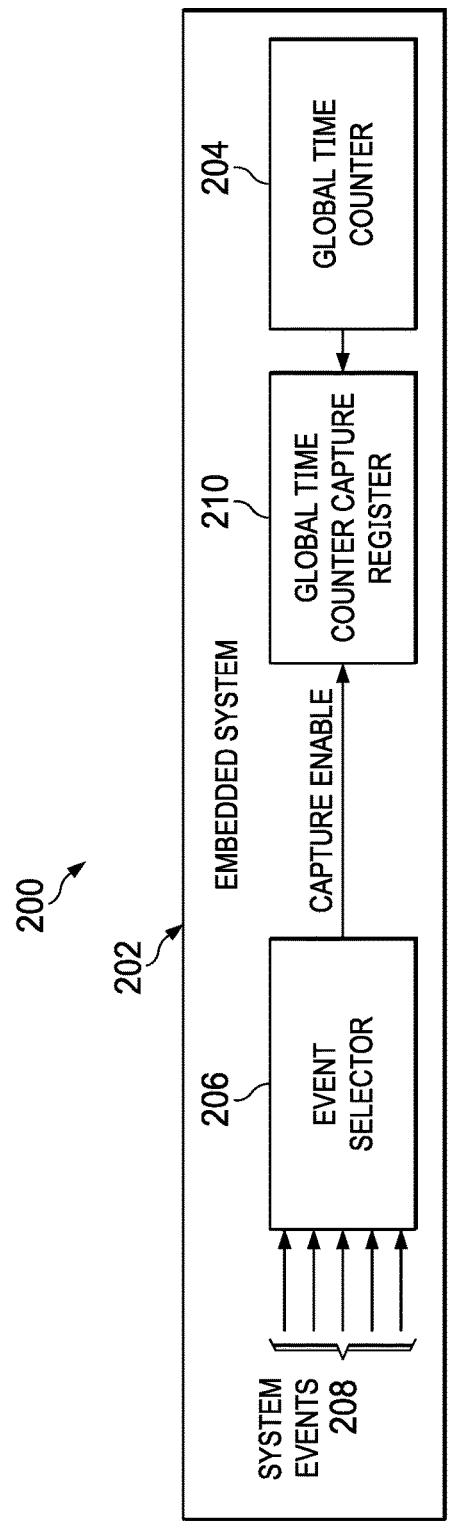
FIG. 2 is a block diagram illustrating components for the global time counter based debug, in accordance with aspects of the present disclosure.

FIG. 2 is a block diagram 200 illustrating components for the global time counter based debug, in accordance with aspects of the present disclosure. As shown, an embedded system 202 may include a global time counter 204. The global time counter 204 may be a free running counter which is started when the embedded system 202 is power cycled (e.g., powered on, booted, started, reset, etc.). For example, the global time counter may be an accumulator which continuously increments on each clock pulse until a maximum value is reached, at which the global time counter may reset to the initial value and continue incrementing. The global time counter 204 may continuously increment until the embedded system 202 is turned off and/or power-cycled. The embedded system 202 may also include an event selector 206 which is configured to receive system events 208 raised, for example, by the processor or possibly any device communicatively coupled to the embedded system 202. The event selector 206 may be coupled to a global time capture register 210. The global time counter capture register 210 may also be coupled to the global time counter 204. The global time counter capture register 210 may be configured to capture a value (a captured counter value) of the global time counter 204 when a certain system event 208 is selected by the event selector 206. In some cases, the event selector 206 and/or global time counter 204 and global time counter capture register 210 may be integrated with one or more processors or may be separate from the processor(s). In some cases, the event selector 206 and/or global time counter 204 and global time counter capture register 210 may be included in different components. For example, the event selector 206 and global time counter 204 may be integrated into a processor, while the global time counter capture register 210 may be integrated into a debug controller. In some cases, the embedded system 202 may be the embedded system 106 as shown in FIG. 1.

Often, when debugging a problem or potential problem, the embedded system 202 may be run in a controlled environment with a predetermined set of inputs configured to reproduce the issue being debugged. The issue being debugged may be associated with a particular event, such as a system event. Generally, system events may be actions or occurrences that have occurred that the embedded system 202 should be aware of and events may be raised asynchronously at any time. As an example, a processor may issue a system event when the processor has finished executing an instruction, when the processor has entered idle, etc. As another example, an interface may issue a system event when a certain input is received or output sent. System events may be acted upon by one or more components of the embedded system. For example, a break event may be a type of system event which the debug controller 114 (as shown in FIG. 1) may detect and act to stop the embedded system.

The event selector 206 may be configured to receive events from any processor and/or device in the embedded system 202 and handle the received events. For example, the event selector 206 may receive events from a coupled ethernet device and transmit an indication of the event to a processor and/or event handler. The global time counter capture register 210 may be mapped to the particular event associated with the debugging being performed and the global time counter capture register 210 may capture the value of the global time counter 204 when the event selector 206 selects the particular event. For example, the event selector 206 may include a register for storing the particular event and a mux. A debugging user may store a particular event (e.g., a value representing the particular event) to the register and trigger the debug routine. As the debug routine runs, system events are compared, such as by the mux, to the particular event value, and when a matching system event is detected, the event selector may select the particular event and trigger the capture of the value of the global time counter 204. This captured counter value may be recorded and output, for example, to the debugging user. In some cases, the event selector 206 may be configured to select multiple events and/or a particular combination of events.

After the captured counter value of the global time counter 204 is captured, the value may be read out, for example via a scan path using Joint Test Action Group (JTAG) action command, another scan interface, another suitable interface, or via processing using software. Once read out, the captured counter value may be modified to help target the break point. For example, the captured counter value may be increased to stop the system being debugged a number of cycles after the event is detected, or decreased to stop the system being debugged a number of cycles before the event is detected. In some cases, a determination of the modified captured counter value of the global time counter 204 may be made by a debugging user. The captured counter value, either modified or not modified, of the global time counter 204 may be used as a comparator value to stop the execution of the embedded system 302 for debugging.

Figure 3:
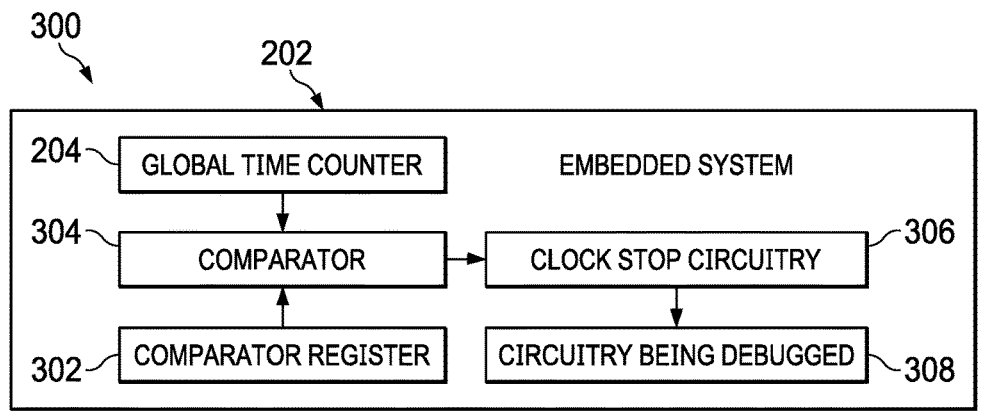
FIG. 3 is a block diagram illustrating additional components for the global time counter based debug of an embedded system, in accordance with aspects of the present disclosure.

FIG. 3 is a block diagram 300 illustrating additional components for the global time counter based debug of an embedded system, in accordance with aspects of the present disclosure. In this example, an embedded system 302 includes the global time counter 202 the global time counter 204 is coupled to a comparator 302. The comparator value based on either a modified or not modified version of the captured counter value of the global time counter 204 may be loaded into the comparator register 302. For example, the target system being debugged may be power cycled and the captured counter value that was previously captured may be loaded into the comparator register 302.

The target system and embedded system 202 may be run again with the predetermined set of inputs used to reproduce the issue being debugged. The comparator 304 may then compare the value of the global time counter 204 against the comparator value loaded into the comparator register 302 as the embedded system 202 is run with the predetermined set of inputs. When the value of the global time counter 204 matches the comparator value loaded into the comparator register 302, the comparator may indicate to a coupled clock stop circuitry 306 to stop the clock circuit of the circuitry being debugged 308. Stopping the clock freezes the flops of the circuits being debugged 308 and then the flop states can be extracted via the scan chains of the circuit design. In some cases, the clock stop circuitry 306 may be configured to trigger a breakpoint, such as a processor breakpoint, to interrupt processing, such as through an ISR.

Figure 4:
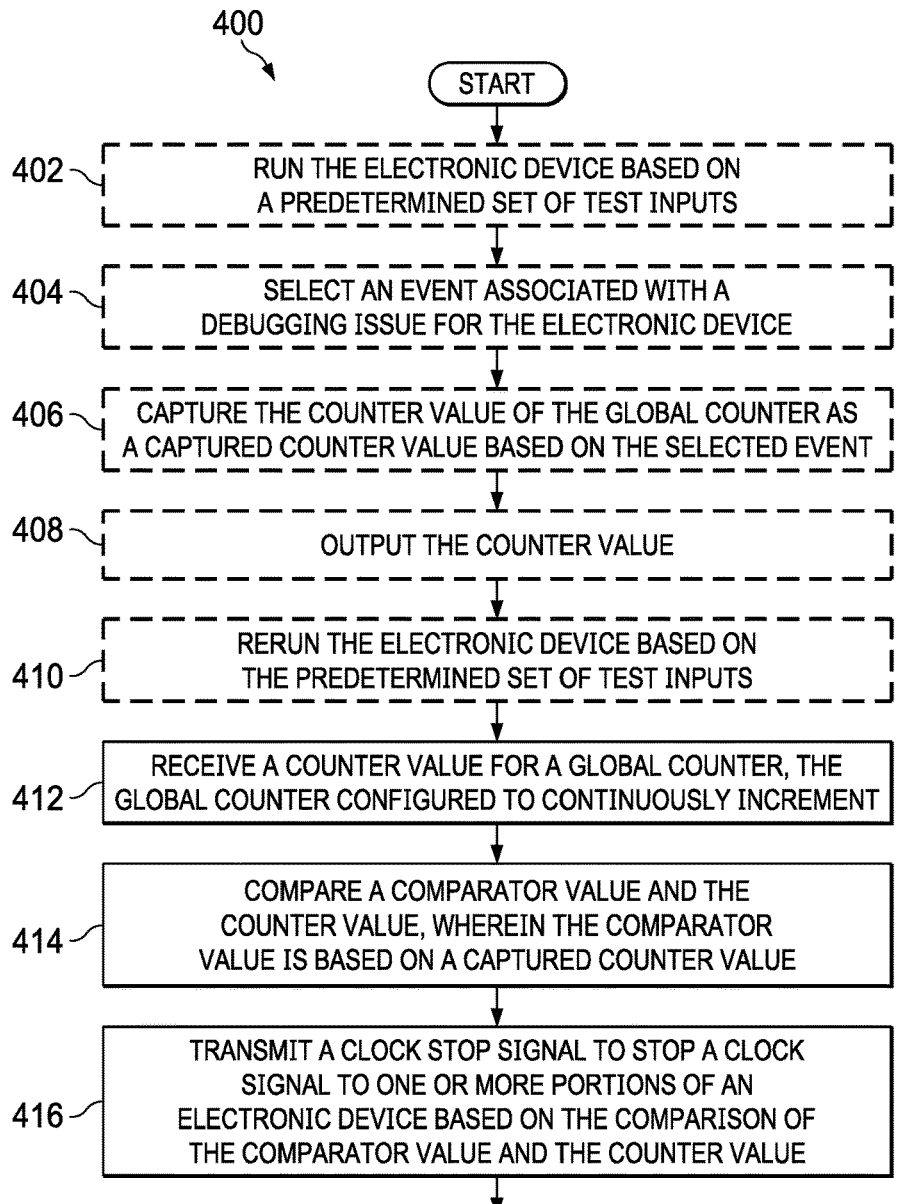
FIG. 4 is a flowchart illustrating a technique for debugging, in accordance with aspects of the present disclosure.

FIG. 4 is a flowchart 400 illustrating a technique for debugging, in accordance with aspects of the present disclosure. Optionally, at block 402, an electronic device may be run based on a predetermined set of test inputs. For example, device and/or circuit being debugged may run an automated suite of tests. Optionally, at block 404, an event associated with the debugging issue for the electronic device may be selected. For example, during execution of the suite of tests, event values may be received and compared to the target value. If an event value matches the target value, the event may be selected. In some cases, a debugging user may determine one or more events, such as a system event, is related to an issue of the device the debugging user is debugging. The debugging user may load a target value representing the system event, for example, to an event selector. In some cases, the target value may be loaded prior to running the suite of tests and event values received during execution of the suite of tests may be checked for matches to the target value. Optionally, at block 406, the counter value of the global counter is captured as a captured counter value based on the selected event. For example, when an event value is selected, a corresponding counter value of the global counter may be obtained and recorded as a captured counter value. Optionally, at block 408, the captured counter value is output. For example, the captured counter value may be read out using a scan tool, interface, or other suitable process. Optionally, at block 410, the electronic device may be rerun based on the predetermined set of test inputs. For example, the device may be reset, a comparator value based on the captured counter value may be stored in a comparator register, and the suite of tests may be rerun on the device.

At block 412, a counter value for a global counter is received, the global counter configured to continuously increment. For example, the device and/or circuit being debugged may include a counter which is started on power up and is incremented when the device/circuit is powered on. In some cases, the counter may be incremented based on a clock of the device/circuit.

At block 414, a comparator value is compared to the counter value, wherein the comparator value is based on a captured counter value. For example, a device/circuit being debugged may be run based on a predetermined set of test inputs. This set of test inputs may be associated with the issue being debugged as well as an event. An indication of this event may be received by the device/circuit being debugged and the event may be detected when the event occurs. When the event is detected, a counter value of the global counter is captured and output, for example, to a debugging host. This counter value may be output out via a JTAG interface, another scan interface, or other suitable interface. The device/circuit may be reset and/or rerun based on the set of test inputs. The device/circuit being debugged may receive, from the debugging host, a comparator value based on the captured counter value via the JTAG interface, other scan interface, or other suitable interface. As the device/circuit runs based on the set of test inputs, the comparator value may be compared to the incrementing counter value.

At block 416, a clock stop signal to stop a clock signal is transmitted to one or more portions of an electronic device based on the comparison of the comparator value and the counter value. For example, when the incrementing counter value matches the comparator value, one or more clock signals for the device/circuit being debugged may be stopped, freezing the circuit design. The circuit design may then be scanned out for debugging.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Modifications are possible in the described embodiments, and other embodiments are possible, within the scope of the claims.

What is claimed is:

1. An electronic device, comprising:
   a global counter configured to provide a counter value;
   a capture register; and
   an event selector circuit coupled to the global counter and to the capture register and configured to:
   store a selection of an event;
   receive a set of event indicators;
   compare the set of event indicators to the selection to detect the event; and
   based on detection of the event, cause the counter value at a first point in time to be stored in the capture register;
   a comparator coupled to the global counter and configured to transmit a clock stop signal based on a comparison of a comparator value and the counter value at a second point in time; and
   a clock stop circuit coupled to the comparator and configured to receive the clock stop signal and stop a clock signal to one or more portions of the electronic device.

2. The electronic device of claim 1, wherein the comparator value is based on a modified value of the counter value at the first point in time.

3. The electronic device of claim 2, wherein the counter value at the first point in time is increased or decreased to determine the comparator value.

4. The electronic device of claim 2, wherein the counter value at the first point in time is modified by a debug host.

5. The electronic device of claim 1, wherein the selection is associated with a combination of events.

6. The electronic device of claim 1, further comprising a comparator register configured to store the comparator value.

7. The electronic device of claim 1, wherein the counter value is continuously incremented based on a clock of the electronic device.

8. The electronic device of claim 1, wherein the global counter is configured to:
   begin incrementing the counter value substantially at power on; and
   continue incrementing the counter value while power is applied.

9. A method comprising:
   incrementing a counter value by a global counter;
   receiving a selection associated with an event;
   receiving an event indicator;
   determining whether to store the counter value at a first point in time in a register based on comparing the event indicator to the selection;
   comparing a comparator value and the counter value at a second point in time; and
   transmitting a clock stop signal to stop a clock signal to one or more portions of an electronic device based on the comparison of the comparator value and the counter value.

10. The method of claim 9, wherein the comparator value is based on a modified value of the counter value at the first point in time.

11. The method of claim 10, wherein the counter value at the first point in time is increased or decreased to determine the comparator value.

12. The method of claim 10, wherein the counter value at the first point in time is modified by a debug host.

13. The method of claim 9, further comprising receiving the comparator value.

14. The method of claim 9, wherein the counter value is continuously incremented based on a clock of the electronic device.

15. The method of claim 9, wherein the incrementing of the counter value by the global counter begins at power on of a circuit device that includes the global counter and continues while power is applied to the circuit device.

16. A circuit comprising:
    a global counter configured to provide a counter value;
    an event circuit coupled to the global counter and configured to:
    store a selection associated with an event;
    receive an event indicator;
    compare the event indicator to the selection to determine whether the event indicator is associated with the event; and
    based on the event indicator being associated with the event, cause the counter value at a first point in time to be stored;

a comparator coupled to the global counter and configured to transmit a clock stop signal based on a comparison of a comparator value and the counter value at a second point in time; and a clock stop circuit coupled to the comparator and configured to receive the clock stop signal and stop a clock signal to one or more portions of an electronic device.

17. The circuit of claim 16, wherein the comparator value is based on a modified value of the counter value at the first point in time.

18. The circuit of claim 17, wherein the counter value at the first point in time is increased or decreased to determine the comparator value.

19. The circuit of claim 17, wherein the counter value at the first point in time is modified by a debug host.

20. The circuit of claim 16, wherein the global counter is configured to:

begin incrementing the counter value when power is applied to the circuit; and continue incrementing the counter value while power is applied to the circuit.

* * * * *